(12) United States Patent
Ueno (10) Patent No.: US 6,478,935 B1
(45) Date of Patent: Nov. 12, 2002

(54) SEMICONDUCTOR DEVICE PLATING APPARATUS

(75) Inventor: Kazuyoshi Ueno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/453,061

(22) Filed: Dec. 2, 1999

Related U.S. Application Data

(62) Division of application No. 09/375,436, filed on Aug. 17, 1999, now Pat. No. 6,221,765.

(30) Foreign Application Priority Data

Aug. 31, 1998 (JP) ............................................. 10-245683

(51) Int. Cl.⁷ ............................................. C25B 15/00
(52) U.S. Cl. ..................... 204/237; 204/267; 204/269; 204/224 R; 118/44
(58) Field of Search ................................ 204/237, 239, 204/267, 269, 274, 224 R; 118/44

(56) References Cited

U.S. PATENT DOCUMENTS 5,344,491 A * 9/1994 Katou ........................ 118/695
6,042,712 A * 3/2000 Mathieu ...................... 205/209
6,136,163 A * 10/2000 Cheung et al. ............. 204/198

FOREIGN PATENT DOCUMENTS

| JP | 7283219 | 10/1995 |
| JP | 883796 | 3/1996 |
| JP | 9-20942 | * 1/1997 |
| JP | 1064903 | 3/1998 |
| JP | 10-158832 | * 6/1998 |
| JP | 11204524 | 7/1999 |
| JP | 11315385 | 11/1999 |
| KR | 92-10840 | 6/1992 |

OTHER PUBLICATIONS

S. Simon Wong et al., "Barrier/Seed Layer Requirements for Copper Interconnects," IITC, Jun. 1–3, 1998, pp. 107–109.

* cited by examiner

*Primary Examiner*—Nam Nguyen
*Assistant Examiner*—Wesley A. Nicolas
(74) *Attorney, Agent, or Firm*—Young & Thompson (57) ABSTRACT

An apparatus for plating a substrate includes plural plating baths that are each separately provided with (a) an individual temperature adjuster that includes a heater, a cooling jacket, and a temperature controller, or (b) an individual pressure application device for distorting the substrate.

2 Claims, 9 Drawing Sheets

A plating-solution flow

A plating-solution flow

SEMICONDUCTOR DEVICE PLATING APPARATUS

CROSS-REFERENCE TO RELATED APPLICATIONS

This application is a division of application Ser. No. 09/375,436, filed Aug. 17, 1999, now U.S. Pat. No. 6,231,765.

BACKGROUND OF THE INVENTION

1. Field of the invention

This invention relates to a method for manufacturing a semiconductor device comprising forming elements such as damascene interconnects and an interlayer connecting hole by a plating technique; and a plating apparatus and a sputtering apparatus therefor.

2. Description of the related art

A sputtering or CVD technique has been commonly used as a metal-film deposition procedure for forming interconnects and an inter-layer connecting hole in a semiconductor device. These techniques, however, require a considerable cost and a complicated process because a great deal of energy is applied to a metal compound to liberate or separate the metal from the corresponding metal compound for depositing the metal on a surface where a semiconductor device will be formed. Furthermore, sputtering may not provide adequate coverage. To solve these problems, electroplating for depositing a metal film has recently received attention.

Figure 5A:
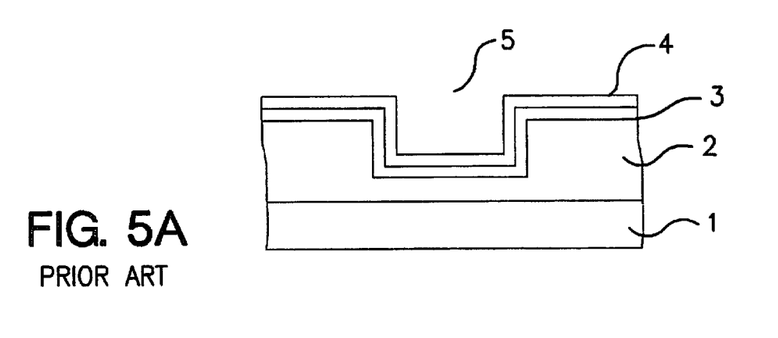

A conventional manufacturing process for a semiconductor device will be described with reference to FIG. 5 in terms of forming damascene copper interconnects.

An insulating film 2 is deposited on a silicon substrate 1 and then a groove 5 is formed in a given area. Then, on the overall surface is deposited by sputtering a barrier-metal film 3 consisting of TiN e.g., 20 nm of thickness. Then, on the surface is deposited by sputtering a seed-metal film 4 consisting of copper for growing copper plating (FIG. 5(a)). The sputtering conditions are, for example, as follows; a substrate temperature: 0° C., a sputter power: 2 kW, a pressure: 2 mTorr, and a distance between a target and the substrate: 60 mm.

Then, the substrate is subject to plating by immersing it in an aqueous solution of cupric sulfate at an ambient temperature.

Figure 5B:
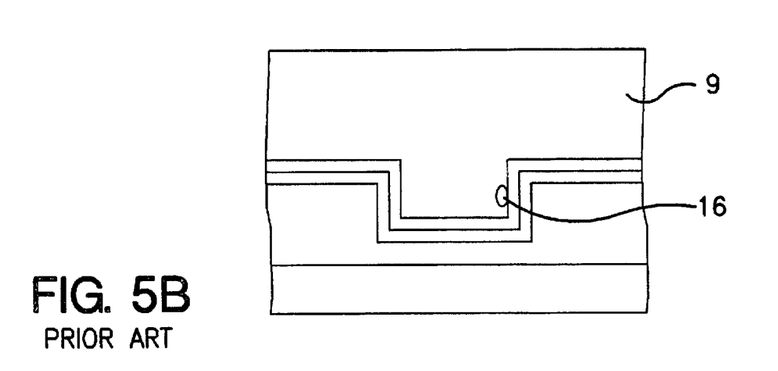

The plated substrate is left at an ambient temperature to stabilize the structure of the copper (FIG. 5(b)). The treatment is hereinafter referred to as "self-annealing". Duration for the self-annealing is generally about 50 to 80 hours.

Then, the substrate surface is smoothed by chemical mechanical polishing (CMP) to form damascene copper interconnects.

The prior art has the following problems.

First, a void may be generated inside the groove or the hole due to shrinkage of the copper plating during the self-annealing step. A copper plating has a sparse structure immediately after plating. After self-annealing the copper structure gradually comes to be thermodynamically stable as grains grow. In the course of the process, copper shrinks to generate a void inside the groove as shown in FIG. 5(b).

Second, small grains in a seed-metal film deposited for forming a plating layer remain after the self-annealing, leading to a less reliable device.

SUMMARY OF THE INVENTION

To solve the above problems, an object of this invention is to prevent void generation inside a groove or hole during forming damascene interconnects or an inter-layer connecting hole. Another object of this invention is to eliminate residual small grains in a seed-metal film for improving reliability of a device.

This invention provides a method for manufacturing a semiconductor device comprising the steps of:

forming an insulating film on a semiconductor substrate and then forming a groove or hole in a given area of the insulating film;

forming a barrier-metal film filling the groove or hole;

forming a seed-metal film on the barrier-metal film formed inside the groove or hole; and forming the first plating film on the seed-metal film using a metal material;

conducting the first annealing for a given period;

forming the second plating film consisting of the above metal material on the first plating film; and conducting the second annealing for a given period.

Plating for forming damascene interconnects has been conventionally conducted in a single step in the light of various factors such as yield. On the other hand, according to this invention, a plating film is formed in two separate steps (hereinafter, referred to as a "divided plating" technique) to prevent void generation inside a groove or hole. Specifically, void generation can be avoided in a groove for forming damascene interconnects or a hole for forming an inter-layer connecting hole. In this invention, the first annealing is conducted after the first plating, i.e., the annealing is conducted when the plating film is thin. The absolute amount of the metal used in the plating process is therefore so small that its shrinkage is reduced and thus a frequency of void generation may be minimized. Even when a void is generated, the film thickness of the plating film is thin in the first annealing, i.e., the distance between the void and the plating surface is short, so that the void may easily disappear. As described above, void generation can be prevented inside the groove or hole.

In this invention, annealing may be self-annealing at an ambient temperature or hot-annealing at an elevated temperature, e.g., 300° C. or higher. Hot-annealing has an advantage of reduction in an annealing time. For example, an annealing time may be about 30 min at a heating temperature of 300° C.

In the method for manufacturing a semiconductor device, the thickness of the first plating film can be 0.1 to 0.5 folds of the width of the groove or hole.

This invention also provides a method for manufacturing a semiconductor device comprising the steps of:

forming an insulating film on a semiconductor substrate and then forming a groove or hole in a given area of the insulating film;

forming a barrier-metal film filling the groove or hole;

forming a seed-metal film on the barrier-metal film formed inside the groove or hole; and forming a plating film on the seed-metal film using a metal material, and then conducting annealing for a given period; and where the metal plating film is formed at a plating temperature of 65 to 100° C.

As described above, shrinkage of a plating metal film is effectively minimized for preventing void generation inside a groove or hole, which may be achieved by plating at a higher temperature of 65 to 100° C. in the method of this invention (hereinafter, referred to as a "hot plating" technique). A metal plating film for forming damascene interconnects has been commonly formed at a relatively lower temperature from an ambient temperature to 60° C. Especially, using copper, the process is generally conducted at an ambient temperature. On the other hand, we have found that when plating is conducted at a higher temperature of 65° C. or higher, grains grow substantially simultaneously with deposition, which can significantly reduce shrinkage of the plating metal film after deposition, prevent void generation and reduce an annealing time. The effects are particularly remarkable at a temperature of 65° C. or higher, and more remarkable at 80° C. or higher although a temperature of 100° C. or higher may be undesirable due to foaming during the plating process.

This invention also provides a method for manufacturing a semiconductor device comprising the steps of:

forming an insulating film on a semiconductor substrate and then forming a groove or hole in a given area of the insulating film;

forming a barrier-metal film filling the groove or hole;

forming a seed-metal film on the barrier-metal film formed inside the groove or hole;

forming a plating film on the seed-metal film using a metal material while distorting the semiconductor substrate into a concave where the center of the surface to be plated extrudes; and conducting annealing for a given period.

In a conventional plating process, a residual tensile stress is generated when a metal material which may initiate self-annealing is used. Such a residual stress is probably generated due to shrinkage of a plating film in association with increase of the grain size of the plating metal during the self-annealing process after forming the plating film.

In other words, a tensile stress in a plating film may act in a direction interfering with shrinkage of the plating film, resulting in inhibiting self-annealing associated with shrinkage of the plating film. Thus, it may be expected that a plating film can be formed in a manner that a compressive stress is generated in the film, to allow a stress to act in a direction enhancing shrinkage of the plating film, i.e., to accelerate self-annealing. This invention is based on the idea. In the method of this invention, a plating film is formed while distorting the semiconductor substrate into a concave shape where the center of the surface to be plated extrudes. Thus, the plating film in which a compressive stress is generated may be formed. It may lead to reducing a self-annealing time and preventing void generation in the groove or hole. The expression, "distorting the semiconductor substrate into a concave shape where the center of the surface to be plated extrudes" means that the substrate is curved into a concave shape where the center of the surface to be plated extrudes like, for example, a substrate 21 in FIG. 7.

This invention also provides a method for manufacturing a semiconductor device comprising the steps of:

forming an insulating film on a semiconductor substrate and then forming a groove or hole in a given area of the insulating film;

forming a barrier-metal film filling the groove or hole;

forming a seed-metal film on the barrier-metal film formed inside the groove or hole in a manner that a residual compressive stress is generated in the seed-metal film;

forming a plating film on the seed-metal film using a metal material and then conducting annealing for a given time.

A seed-metal film for forming a plating film has been conventionally formed by, for example, sputtering, in which a residual tensile stress is generated in the seed-metal film. Such a residual tensile stress may probably act in a direction interfering with shrinkage of the plating film formed on the seed-metal film. So, a residual tensile stress in the seed-metal film may interfere with self-annealing associated with shrinkage of the plating film. Thus, it may be expected that by generating a residual compressive stress in the seed-metal film, the stress acts in a direction enhancing shrinkage of the plating film, i.e., enhancing self-annealing. According to the method of this invention based on the idea, a self-annealing time may be reduced and void generation may be avoided in the groove or hole.

There may be a variety of methods for generating a residual compressive stress. The followings are, for example, preferable.

The first is a method for manufacturing a semiconductor device where the seed-metal film is formed by sputtering, characterized in that the seed-metal film is formed while distorting the semiconductor substrate into a concave shape toward a target. Thus, when the substrate is removed from a sputtering apparatus, a residual compressive stress is generated in the seed-metal film.

The second is a method characterized in that the seed-metal film is formed by collimate sputtering. It has been found from our studies that a residual compressive stress may be generated in the seed-metal film when using a collimate sputtering technique.

This invention also provides a method for manufacturing a semiconductor device comprising the steps of:

forming an insulating film on a semiconductor substrate and then forming a groove or hole in a given area of the insulating film;

forming a barrier-metal film filling the groove or hole;

forming a seed-metal film on the barrier-metal film formed inside the groove or hole; and forming a plating film on the seed-metal film using a metal material; and where the seed-metal film is (111) oriented.

This invention also provides a method for manufacturing a semiconductor device comprising the steps of:

forming an insulating film on a semiconductor substrate and then forming a groove or hole in a given area of the insulating film;

sequentially forming a Ti film and a TiN film filling the groove or hole;

forming a seed-metal film on the TiN film formed inside the groove or hole; and forming a plating film on the seed-metal film using a metal material; and where the seed-metal film is (111) oriented.

A seed-metal film is less (111) oriented in the prior art, but a metal, e.g., copper, film on the seed-metal film tends to be (111) oriented. Thus, small grains often remain in the seed-metal film after annealing. On the other hand, in the method for manufacturing a semiconductor device according to this invention, a seed-metal film is (111) oriented to effectively minimize residual small grains. A seed-metal film having (111) orientation may be formed by, for example, sequentially forming a Ti film and a TiN film filling a groove or hole formed in an insulating film and then forming a seed-metal film. As described above, forming a TiN film and then a TiN film may improve the orientation of the TiN film, resulting in a (111) oriented seed-metal film on the TiN film.

In these methods for manufacturing a semiconductor device, a material for the seed-metal film and the above metal material are preferably Cu, Ag or an alloy thereof. The metal materials may initiate self-annealing to provide a metal film suitable for a semiconductor device. Although these metal materials have a lower resistance and have an advantage that they minimize problems such as electromigration, they may cause a problem of frequent void generation during a plating or self-annealing process. The metal materials may be, therefore, used for significantly enhancing the effects of this invention.

These methods for manufacturing a semiconductor device may be employed in combination. For example, in a divided plating technique, the first and/or the second plating films may be formed by hot plating. In divided plating, hot plating or a combination thereof, a semiconductor substrate may be plated while being distorted into a concave shape or a seed-metal film may be formed in a manner that a residual compressive stress is generated. Since these techniques are not harmful each other, these may be combined to be synergically effective for more remarkably inhibiting a void and reducing a self-annealing time.

This invention also provides a plating apparatus and a sputtering apparatus used for manufacturing a semiconductor device according to the method of this invention.

Specifically, this invention provides plating apparatus comprising a plating-solution feeding tank for feeding a plating solution, a plurality of plating baths for plating a substrate placed therein, and a liquid-circulating line interconnecting the plating-solution feeding tank and the plating bath for circulating the plating solution, the individual plating baths being separately provided with a temperature-adjusting means.

This plating apparatus is provided with separate temperature-adjusting means in its individual plating baths. One plating apparatus may, therefore, simultaneously plate a plurality of substrates at different plating temperatures to improve yield. For example, plating at an ambient temperature and hot plating suggested in this invention may be simultaneously conducted in a single plating apparatus. In a method suggested in this invention where plating is divided into two steps, the above plating apparatus may be effective when the first and the second steps are conducted at different temperatures. Using the above plating apparatus may reduce the required number of the plating apparatus, which may contribute space-saving for installing the apparatuses.

This invention also provides plating apparatus comprising a plating-solution feeding tank for feeding a plating solution, a plurality of plating baths for plating a substrate placed therein, and a liquid-circulating. line interconnecting the plating-solution feeding tank and the plating bath for circulating the plating solution; the plating baths having an electrode and a substrate holder for placing a substrate to be treated facing the electrode and the substrate holder having a means for distorting the substrate. The term "distorting" indicates that the substrate is distorted into a convex or concave shape.

This invention also provides the above plating apparatus where the means for distorting the substrate to be treated is a pressing means for applying pressure to the substrate on its rear face and the pressing means applies a pressure to the center of the substrate different from that to its side.

These plating apparatuses are suitable for conducting a method for manufacturing a semiconductor comprising a step that a semiconductor substrate is plated while being distorted into a concave shape, to form a plating film. Using these plating apparatuses, a substrate may be distorted into a concave shape for plating without being deteriorated, leading to reduction in a self-annealing time and prevention of void generation inside a groove or hole. In particular, a plating apparatus equipped with the above pressing means can precisely control the deformation of a substrate (extent of distortion) by adjusting a pressure, allowing the deformation to be set to the most effective value for, e.g., reduction of a self-annealing time.

The means for distorting a substrate to be treated in the above plating apparatuses, for example, distorts the substrate into a concave in a manner that the center of the substrate extrudes toward the electrode. The pressing means in the plating apparatuses may, for example, apply a higher pressure to the center of the substrate to be treated than that to its side.

This invention also provides a sputtering apparatus comprising a chamber equipped with an exhaust system; a target placed in a given position in the chamber; an electrode generating sputter discharge for sputtering the target; and a substrate holder for retaining a substrate to be treated facing and parallel to the target, the substrate holder having a means for distorting the substrate. The expression "distorting" herein means deforming a substrate into a convex or concave.

Self-annealing of a plating film may be accelerated by generating a residual compressive stress in a seed-metal film. A residual compressive stress may be effectively generated in a seed-metal film by forming the film while distorting a substrate to be treated into a concave toward the target. The sputtering apparatus of this invention is suitable for conducting the procedure. Using the sputtering apparatus, the substrate distorted into a concave can be sputtered to generate a compressive stress in the seed-metal film when the substrate is removed from the apparatus. A plating film is formed on the substrate. Then self-annealing may be conducted, leading to reduction in a self-annealing time. This sputtering apparatus has an advantage that distortion of a substrate can be controlled to appropriately adjust a compressive stress.

In particular, a sputtering apparatus equipped with the above pressing means can easily distort a substrate to form a good seed-metal film. Furthermore, deformation (extent of distortion) may be precisely controlled by adjusting a pressure, which allows the deformation of the substrate to be set to the most effective value for, e.g., reduction in a self-annealing time.

The means for distorting a substrate to be treated in the above sputtering apparatus, for example, distorts the substrate into a concave shape in a manner that the center of the substrate extrudes toward the electrode. The pressing means in the sputtering apparatus may, for example, apply a higher pressure to the center of the substrate to be treated than that to its side.

As described above, in a method for manufacturing a semiconductor device according to this invention, a plating metal film is formed in two separate steps or at an elevated temperature of 65 to 100° C., leading to inhibiting void generation inside a groove or hole and further reduction in a self-annealing time in hot plating.

In a method for manufacturing a semiconductor device according to this invention, a substrate distorted into a concave shape is plated or a seed-metal film is formed in a manner that a residual compressive stress is generated. It can accelerate self-annealing involving shrinkage of a plating film, i.e., reduction in a self-annealing time. Furthermore, void generation inside a groove or hole may be inhibited.

In a plating apparatus according to this invention, each plating bath is equipped with a separate temperature-adjusting means, which permits simultaneous plating of a plurality of substrates at different plating temperatures in a single plating apparatus, leading to improvement of an yield.

Using a plating apparatus according to this invention, a substrate distorted into a concave shape can be plated to generate a desired compressive stress in a plating film, leading to reduction in a self-annealing time.

Using a sputtering apparatus according to this invention, a substrate distorted into a concave shape can be subject to sputtering to generate a desired compressive stress in a seed-metal film, leading to reduction in a self-annealing time.

BRIEF DESCRIPTION OF THE DRAWINGS

FIG. 1 (a), (b), and (c) is a process sectional view of a method for manufacturing a semiconductor device according to this invention.

FIG. 3 (a) and (b) is a process sectional view of a method for manufacturing a semiconductor device according to this invention.

FIG. 4 (a), (b), and (c) is a process sectional view of a method for manufacturing a semiconductor device according to this invention.

FIG. 5 (a) and (b) is a process sectional view of a conventional method for manufacturing a semiconductor device.

DETAILED DESCRIPTION OF THE PREFERRED EMBODIMENTS

Embodiment 1

Figure 1A:
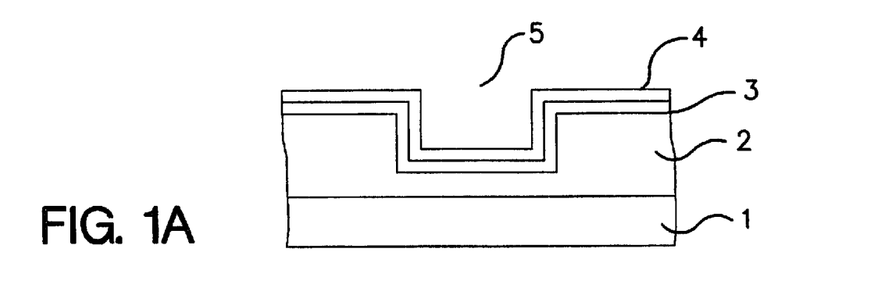

This embodiment involves a plating process consisting of two separate steps, which will be described with reference to FIG. 1.

An insulating film 2 is deposited on a silicon substrate 1 and then a groove 5 is formed in a given area. Then, on the overall surface is deposited by sputtering a barrier-metal film 3 consisting of TiN e.g., 20 nm of thickness. Then, on the surface is deposited by sputtering a seed-metal film 4 consisting of copper for growing copper plating (FIG. 1(a)). The sputtering conditions are, for example, as follows; a substrate temperature: 0° C., a sputter power: 2 kW, a pressure: 2 mTorr, and a distance between a target and the substrate: 60 mm.

Figure 1B:
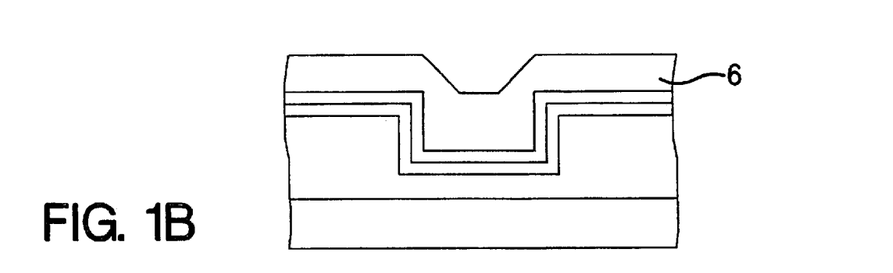

Then, the substrate is immersed in an aqueous solution of cupric sulfate at an ambient temperature (about 15 to 30° C.) to form the first plating film 6 (FIG. 1(b)). The thickness of the plating film 6 is preferably 0.1 to 0.5 folds, more preferably 0.2 to 0.4 folds of the width of the groove 5. If it is too thick, a void cannot be adequately inhibited while if it is too thin, a major part of the groove 5 must be filled with the second plating, leading to less effective inhibition of void generation.

The substrate thus plated is subject to the first annealing. The annealing process is conducted at an ambient temperature of about 15 to 30° C., preferably for 2 to 10 hours, more preferably 4 to 8 hours. An annealing period may be appropriately set depending on the thickness of the first plating film 6. The self-annealing can stabilize the structure of the copper to provide copper having a large grain size. Annealing may be conducted at an elevated temperature. For example, hot annealing may be conducted at 300° C. for 30 min.

Figure 1C:
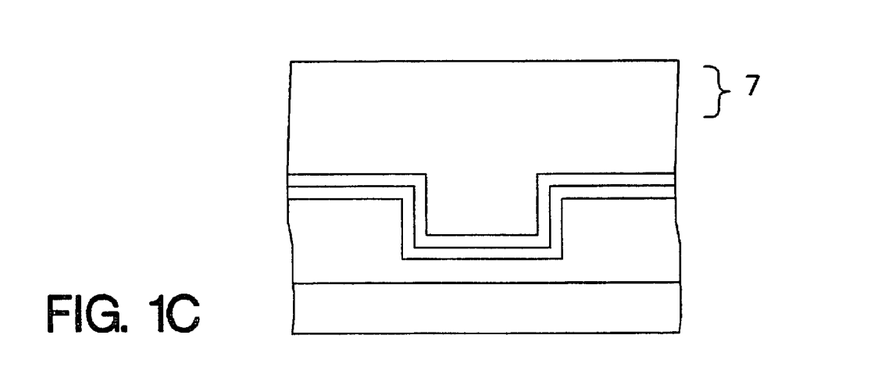

Then, the substrate is immersed in an aqueous solution of cupric sulfate at an ambient temperature to form the second plating film 7, by which the groove 5 is completely filled with copper (FIG. 1(c)).

Then, the second annealing is conducted at an ambient temperature, whose duration may be appropriately determined depending on the thickness of the second plating film 7. The self-annealing can stabilize the structure of the copper to give copper having a large grain size. Annealing may be also conducted at an elevated temperature as is the first annealing.

The total duration of the first and the second annealing processes is preferably 10 to 40 hours, more preferably 20 to 35 hours. According to the method of this embodiment, such short annealing may be adequately effective. In the light of a production efficiency, the above duration is preferable.

Figure 2:
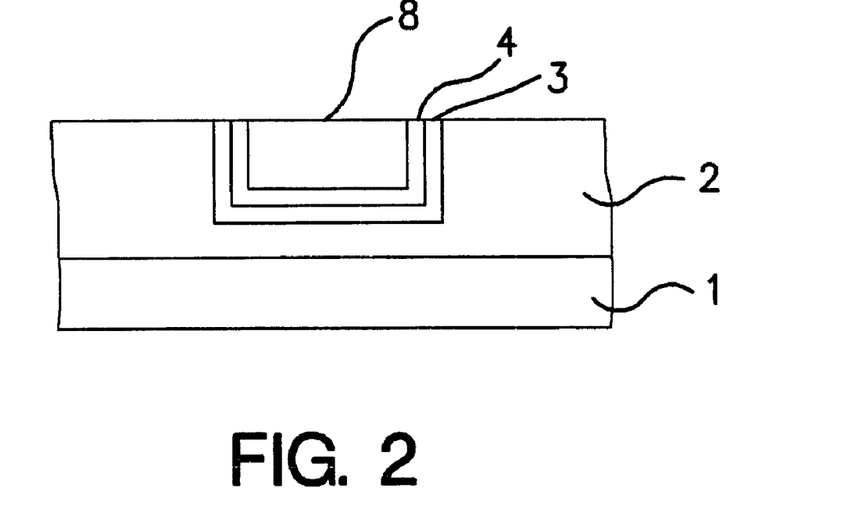
FIG. 2 is a process sectional view of a method for manufacturing a semiconductor device according to this invention.

Then, the barrier-metal film 3 and the filling metal are polished by CMP to smooth the surface of the substrate to form damascene interconnects (FIG. 2).

Embodiment 2

This embodiment involves hot plating, which will be described with reference to FIG. 3.

An insulating film 2 is deposited on a silicon substrate 1 and then a groove 5 is formed in a given area. Then, on the overall surface is deposited by sputtering a barrier-metal film 3 consisting of TiN e.g., 20 nm of thickness. Then, on the surface is deposited by sputtering a seed-metal film 4 consisting of copper for growing copper plating (FIG. 3(a)).

The sputtering conditions are, for example, as follows; a substrate temperature: 0° C., a sputter power: 2 kW, a pressure: 2 mTorr, and a distance between a target and the substrate: 60 mm.

Figure 3A:
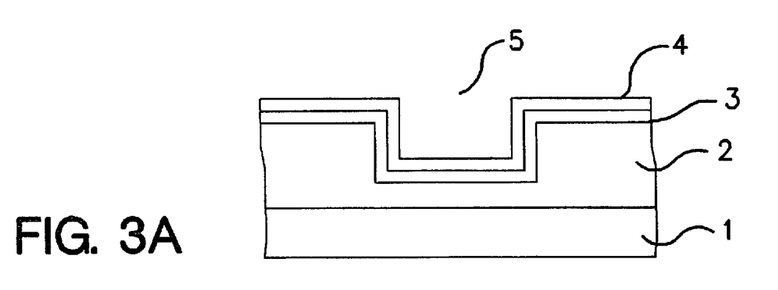
Figure 3B:
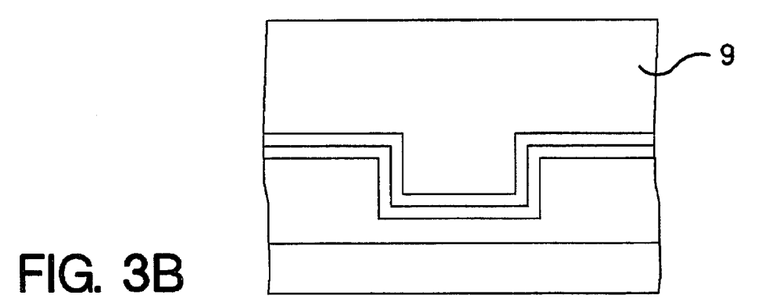

Then, the substrate is immersed in an aqueous solution of cupric sulfate at an elevated temperature of 65 to 100° C. to form a plating film 9 (FIG. 3(b)). The plating film 9 is formed, completely filling the groove 5. Forming the plating film at such an elevated temperature may provide a good metal film with less shrinkage in the annealing process, leading to inhibition of void generation and reduction in a self-annealing.

The substrate thus plated is annealed at an ambient temperature for 1 to 40 hours, more preferably 1 to 10 hours. Since the plating film is formed at an elevated temperature, an annealing time is reduced.

Then, the barrier-metal film 3 and the filling metal are polished by CMP to smooth the surface of the substrate to form damascene interconnects (not shown).

Embodiment 3

Figure 6:
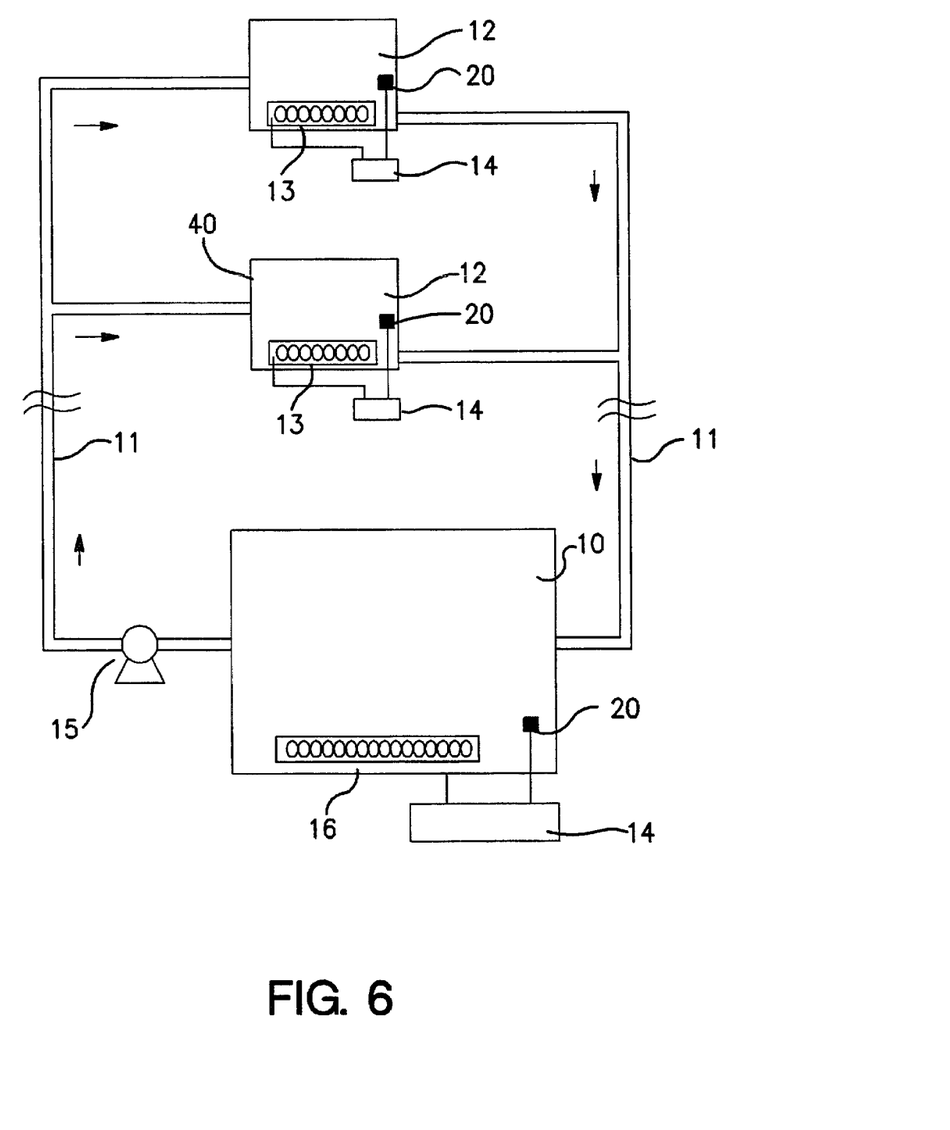
FIG. 6 schematically shows a plating apparatus according to this invention.

FIG. 6 schematically shows the structure of a plating apparatus according to this invention. A plating-solution feeding tank 10 is filled with a plating solution such as an aqueous solution of cupric sulfate. A circulating pump 15 is provided for feeding the plating solution to each plating bath 12 via a plating-solution circulating line 11. Each plating bath is provided with a separate temperature-adjusting means consisting of a heater 13, a thermometer 20 and a temperature controller 14. It allows a single plating apparatus to simultaneously conduct a plurality of plating processes at different plating temperatures. In this regard, the plating apparatus is different from a conventional plating apparatus in which a plating-solution feeding bath is equipped with a temperature-adjusting means.

As shown in the figure, the temperature-adjusting means comprises a heating means and a temperature controller and may comprise, if desired, a cooling means. The heating means may be a heater, while the cooling means may be a water-cooling jacket 40. The temperature controller may be a PID type of temperature controller.

In this plating apparatus, besides the plating baths, the plating-solution feeding tank is equipped with a separate temperature-adjusting means consisting of a cooling means 16 and a temperature controller 14. By providing such a temperature-adjusting means, plating solutions from individual plating baths which have been adjusted to different temperatures, may be again controlled for their temperature to a given temperature after returning to the plating-solution feeding means. Thus, the temperature of each plating bath may be easily adjusted.

Embodiment 4

This embodiment shows an example of plating a substrate distorted into a concave.

FIG. 3 shows a process of a method for manufacturing a semiconductor device according to this invention. An insulating film 2 is deposited on a silicon substrate 1 and then a groove 5 is formed in a given area. Then, on the overall surface is deposited by sputtering a barrier-metal film 3 consisting of TiN e.g., 20 nm of thickness. Then, on the surface is deposited by sputtering a seed-metal film 4 consisting of copper for growing copper plating (FIG. 3(a)).

Then, the substrate is immersed in an aqueous solution of cupric sulfate at an ambient temperature to form a plating film 9 which completely fills the groove 5.

Figure 7:
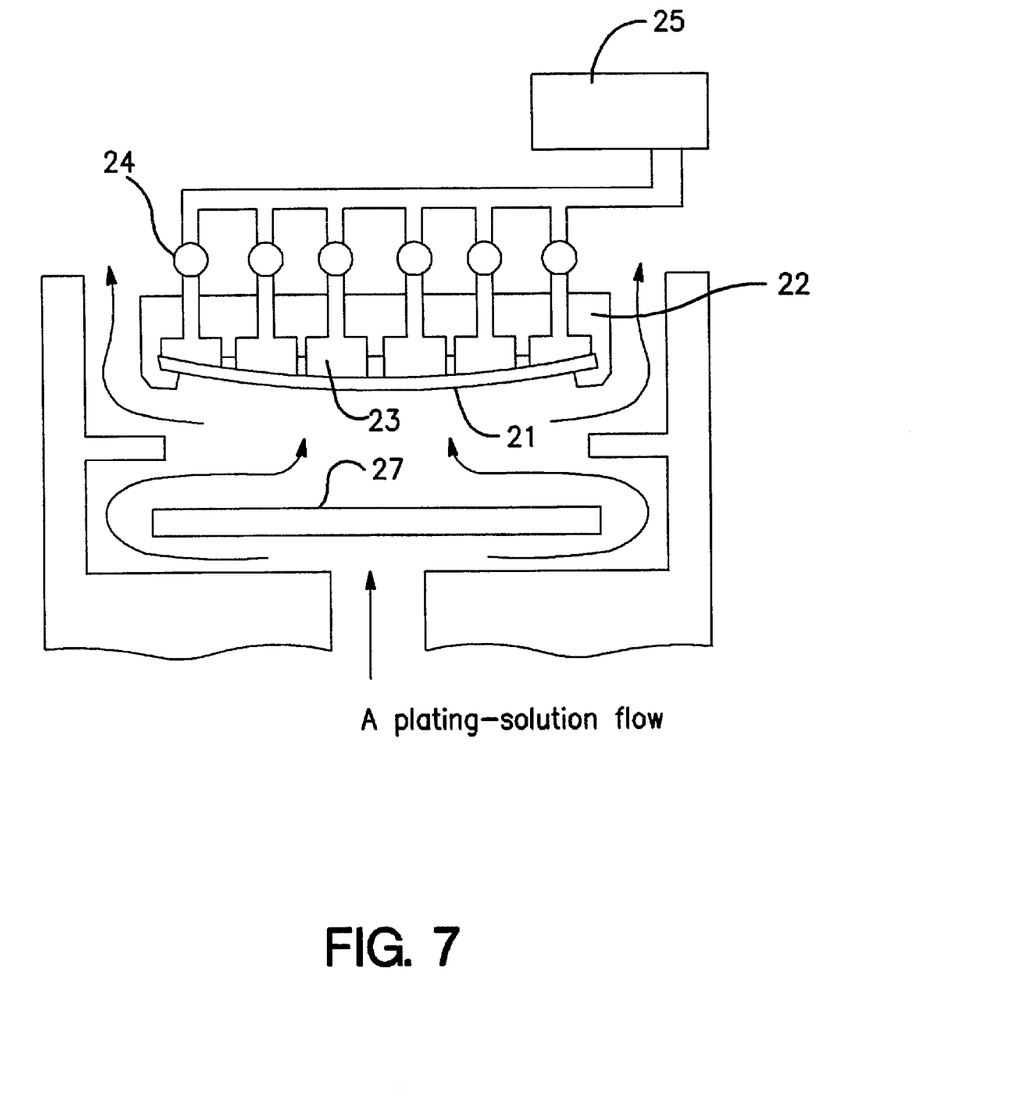
FIG. 7 schematically shows a plating apparatus according to this invention.
Figure 8:
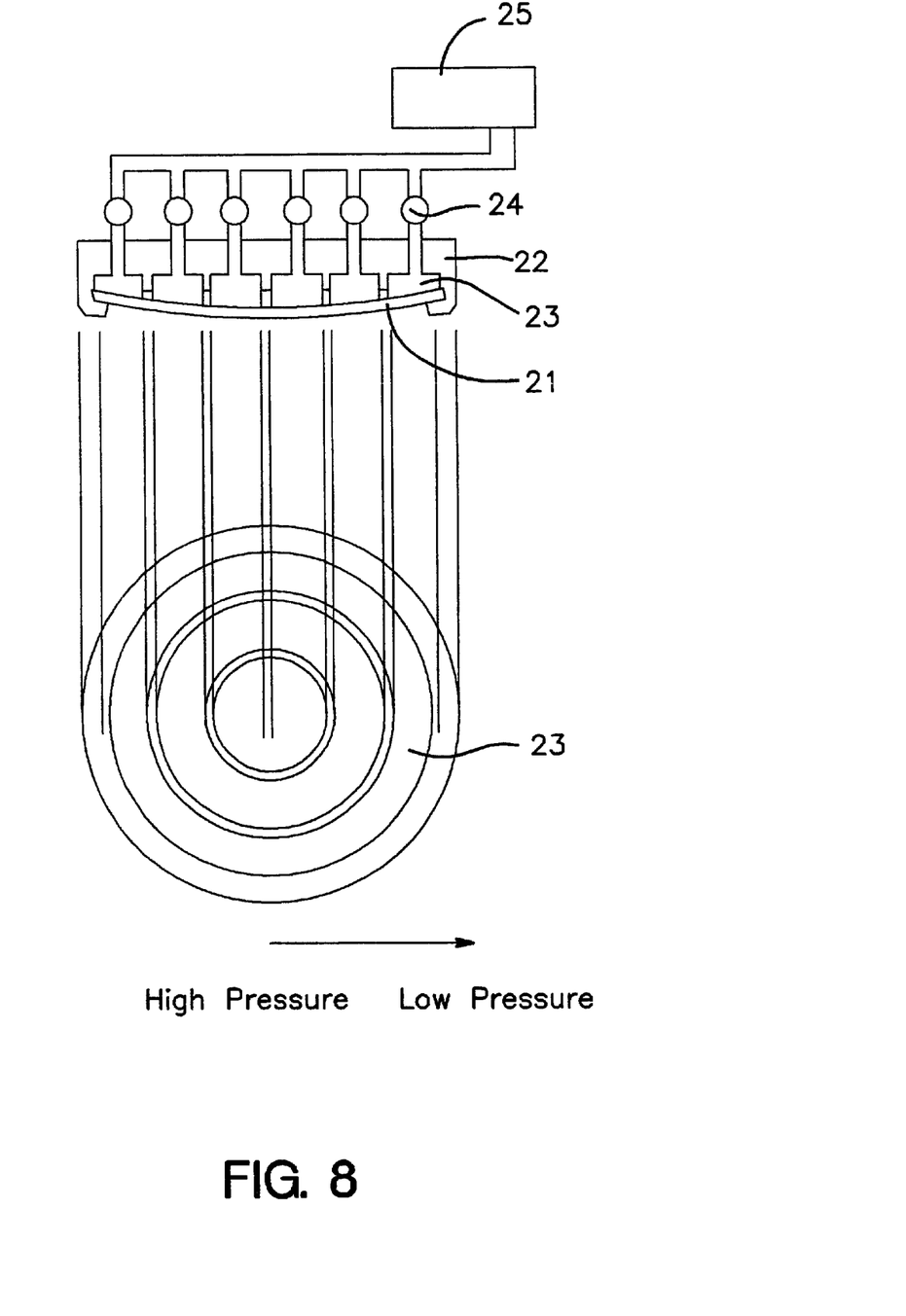
FIG. 8 illustrates the structure of a substrate holder in a plating apparatus according to this invention.

In the above process, the plating apparatus shown in FIGS. 6 to 8 is used. FIG. 6 schematically shows the structure of the plating apparatus according to this invention. A plating-solution feeding tank 10 is filled with a plating solution such as an aqueous solution of cupric sulfate. A circulating pump 15 is provided for feeding the plating solution to each plating bath 12 via a plating-solution circulating line 11. Each plating path is a separate temperature-adjusting means consisting of a heater 13, a thermometer 20 and a temperature controller 14. FIG. 7 is an enlarged view of the plating bath 12 in FIG. 6. The plating bath is equipped with an anode 27 and a substrate holder 22 for placing a substrate 21 facing the anode. The substrate holder 22 is equipped with a pressing means for distorting the substrate 21 into a concave in a manner that the center of the substrate 21 extrudes toward the anode 27. In the figure, a thermometer and a heater are not shown.

The structure of the pressing means will be detailed with reference to FIG. 8. The substrate holder 22 on the rear face of a substrate is divided into a plurality of concentric circular compartments as shown in the figure. The space of each compartment is occupied by a water-pillow-like pressure bag which is filled with a pressure medium. In this embodiment, the pressure bag 23 has a doughnut shape, whose wall may be made of a heat-resistant resin such as a fluororesin. The pressure medium filled in the pressure bag 23 may be, but not limited to, water or the air. Each pressure bag 23 is connected with a pressure-medium source 25 via a pressure control valve 24. Different pressures are applied to individual pressure bags by the pressure medium source 25 and the pressure control valve 24, in a manner that the highest pressure is applied to the pressure bag placed on the center of the rear face of the substrate, i.e., the center most extrudes (FIG. 8). Thus, the substrate can be distorted into a concave toward the anode 27 as shown in FIG. 7.

Plating the substrate distorted into a concave may generate a compressive stress when the substrate is removed from the apparatus.

Then, the substrate is subject to annealing at an ambient temperature for 10 to 40 hours. Since the seed-metal film 4 has a residual compressive stress, such a short annealing may be adequately effective. Then, the barrier-metal film 3 and the filling metal are polished by CMP to smooth the surface of the substrate to form damascene interconnects.

In this embodiment, a pressure bag is shown as a means for distorting a substrate into a concave during forming a plating film, but any other proper means may be employed; for example, pressing the rear face of the substrate with a plurality of bars.

Embodiment 5

This embodiment shows an example of a process for forming a seed-metal film while distorting a substrate into a concave.

FIG. 3 shows a process of a method for manufacturing a semiconductor device according to this invention. An insulating film 2 is deposited on a silicon substrate 1 and then a groove 5 is formed in a given area. Then, on the overall surface is deposited by sputtering a barrier-metal film 3 consisting of TiN e.g., 20 nm of thickness. Then, on the surface is deposited by sputtering a seed-metal film 4 consisting of copper for growing copper plating (FIG. 3(a)).

Figure 9:
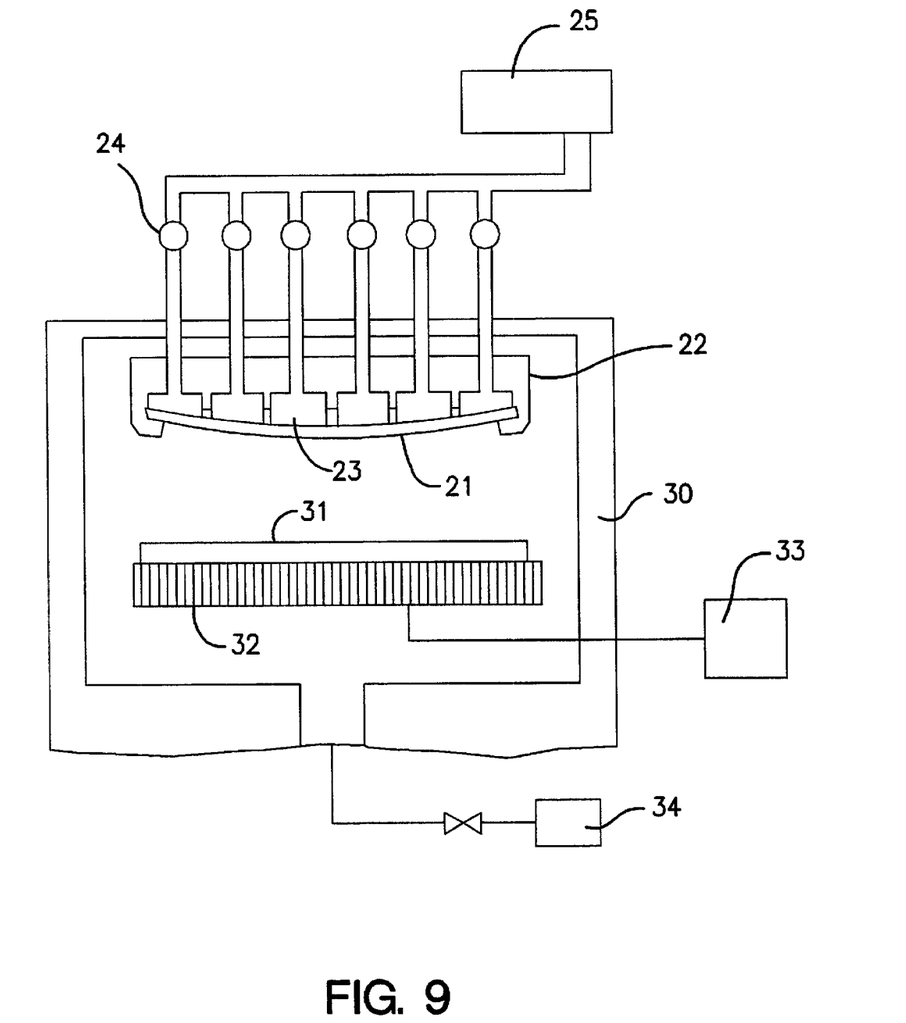
FIG. 9 schematically shows a sputtering apparatus according to this invention.

In the above process, the sputtering apparatus shown in FIG. 9 is used. The sputtering apparatus comprises a vacuum chamber 30 equipped with an exhaust system 34; a target 31 placed in a given position in the chamber; an electrode 32 generating sputter discharge for sputtering the target 31; and a substrate holder 22 for retaining a substrate 21 to be treated facing and parallel to the target 31. The electrode 32 is connected with a source for discharge 33. The substrate holder 22 is equipped with a pressing means for applying a pressure to the substrate 21 on its rear face. The pressing means applies a higher pressure to the center of the substrate 21 than that to its side, so that the substrate 21 is distorted into a concave in a manner that the center of the substrate 21 extrudes toward the target 31. The structure of the pressing means is as described for Embodiment 4 with reference to FIG. 7.

Sputtering the substrate distorted into a concave may generate a compressive pressure in the seed-metal film 4 when the substrate is removed from the apparatus.

Then, the substrate is immersed in an aqueous solution of cupric sulfate at an ambient temperature to form a plating film which completely fills the groove 5. Then, the substrate is subject to annealing at an ambient temperature for 10 to 40 hours. Since the seed-metal film 4 has a residual compressive stress, such a short annealing may be adequately effective.

Then, the barrier-metal film 3 and the filling metal are polished by CMP to smooth the surface of the substrate to form damascene interconnects.

In this embodiment, a pressure bag is shown as a means for distorting a substrate into a concave during forming a seed-metal film 4 by sputtering, but any other proper means may be employed; for example, pressing the rear face of the substrate with a plurality of bars.

Embodiment 6

In Embodiment 5, a seed-metal film 4 is formed by sputtering while distorting a substrate to be treated, so that a residual compressive stress is generated in the seed-metal film 4. Alternatively, a residual compressive stress may be generated by collimate sputtering in which a distance between a target and a substrate is enlarged.

It is not fully clear why collimate sputtering may generate a compressive stress, but it may be speculated that sputter particles reaching the surface of the substrate have a kinetic energy in a direction perpendicular to the substrate exceeding a given level, so that a sputter film with a relatively higher film density may be formed.

The collimate sputtering may be conducted under the conditions of a distance between a target and a substrate: 100 to 300 mm; an aspect ratio of the collimator, i.e., a ratio of the depth to the diameter of the hole: 1 to 2; a sputter power: 1 to 30 kW; and a sputter pressure: 1 to 10 mTorr.

EXAMPLES

Example 1

Figure 4A:
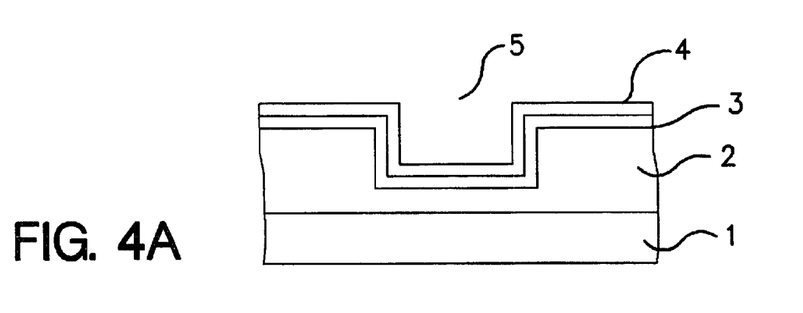
Figure 4B:
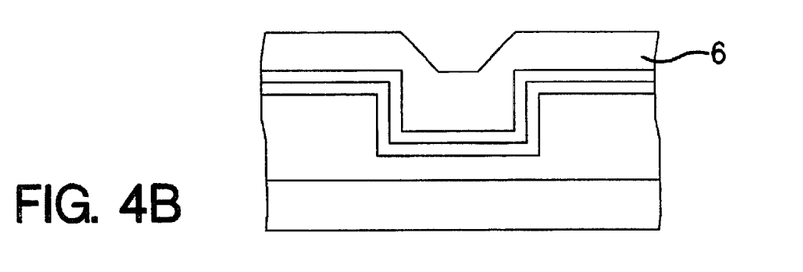
Figure 4C:
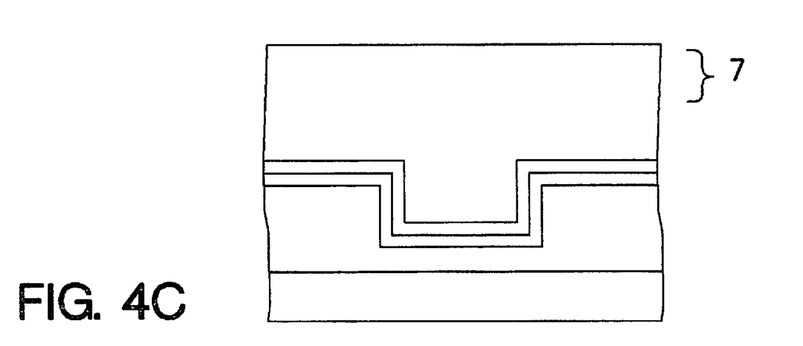

This example involves a plating process consisting of two separate steps, in which the second step is conducted at an elevated temperature. It will be described with reference to FIG. 4.

An insulating film 2 was deposited on a silicon substrate 1 and then a groove 5 with a width of about 0.3 $\mu$m and a depth of 0.5 $\mu$m was formed in a given area. Then, on the overall surface was deposited by sputtering a barrier-metal film 3 consisting of TiN with a thickness of 20 nm. Then, on the surface was deposited by sputtering a seed-metal film 4 consisting of copper for growing copper plating (FIG. 4(a)). The sputtering conditions were as follows; a substrate temperature: 0° C., a sputter power: 2 kW, a pressure: 2 mTorr, and a distance between a target and the substrate: 60 mm.

Then, the substrate was immersed in an aqueous solution of cupric sulfate at 25° C. to form the first plating film 6. The thickness of the first plating film 6 was 90 nm in a smooth part (FIG. 4(b)).

The substrate thus plated was subject to the first annealing at 25° C. for 5 hours.

Then, the substrate was again immersed in a solution having the same composition as the above aqueous solution of cupric sulfate at 70° C. to form the second plating film 7 with a thickness of 5 $\mu$m by which the groove 5 was completely filled with copper (FIG. 4(c)).

The substrate was then subject to the second annealing at an ambient temperature for 25 hours.

Then, the barrier-metal film 3 and the filling metal were polished by CMP to smooth the surface of the substrate to form damascene interconnects 8 (FIG. 2).

It was found by observation the cross-section of the prepared interconnect structure with a scanning electron microscope that the interconnects were appropriately embedded without voids.

Example 2

An interconnect structure was fabricated as described in Example 1, except that a seed-metal film 4 was formed using a sputtering apparatus shown in FIG. 9.

When placing a substrate in a substrate holder shown in FIG. 9, a curvature of the substrate was about 1 mm, i.e., the center of the substrate extruded by 1 mm in relation to its side.

Sputtering was conducted under the conditions of a distance between a target and the substrate: 120 mm; a sputter power: 10 kW; a sputter pressure: 50 mTorr. and a substrate temperature: 0° C.

Another sputter film formed under the above conditions was measured for its film stress by x-ray diffraction. The film stress was about $1 \times 10^9$ dyne/cm$^2$ in a compression direction.

After forming a seed-metal film 4 by sputtering, the first and the second plating films 6 and 7 were formed as described in Example 1. Then, the barrier-metal film 3 and the filling metal were polished by CMP to smooth the surface of the substrate to form damascene interconnects.

It was found by observation the cross-section of the prepared interconnect structure with a scanning electron microscope that the interconnects were appropriately embedded without voids.

Example 3

An interconnect structure was fabricated as described in Example 1, except that a seed-metal film 4 was formed by collimate sputtering.

The collimate sputtering was conducted under the conditions of a distance between a target and a substrate: 200 mm; an aspect ratio of the collimator, i.e., a ratio of the depth to the diameter of the hole: 1; a sputter power: 10 kW; a sputter pressure: 50 mTorr; and a substrate temperature: 0° C.

Another sputter film formed under the above conditions was measured for its film stress by x-ray diffraction. The film stress was about $1 \times 10^9$ dyne/cm$^2$ in a compression direction.

After forming a seed-metal film 4 by sputtering, the first and the second plating films 6 and 7 were formed as described in Example 1. Then, the barrier-metal film 3 and the filling metal were polished by CMP to smooth the surface of the substrate to form damascene interconnects.

It was found by observation the cross-section of the prepared interconnect structure with a scanning electron microscope that the interconnects were appropriately embedded without voids.

This application is based on application NO.HEI10-245683, the content of which is incorporated hereinto by reference.

What is claimed is:

1. A plating apparatus comprising a plating-solution feeding tank for feeding a plating solution, a plurality of plating baths for plating a substrate placed therein, and a liquid-circulating line interconnecting the plating-solution feeding tank and the plating bath for circulating the plating solution; the plating baths having an electrode and a substrate holder for placing a substrate to be treated facing the electrode and the substrate holder having a means for distorting the substrate.

2. A plating apparatus as claimed in claim 1 where the means for distorting the substrate to be treated is a pressing means for applying pressure to the substrate on its rear face and the pressing means applies a pressure to the center of the substrate different from a pressure applied to the substrates outer periphery.

* * * * *